United States Patent
Travis et al.

(10) Patent No.: US 6,611,045 B2
(45) Date of Patent: Aug. 26, 2003

(54) METHOD OF FORMING AN INTEGRATED CIRCUIT DEVICE USING DUMMY FEATURES AND STRUCTURE THEREOF

(75) Inventors: Edward O. Travis, Austin, TX (US); Sejal N. Chheda, Austin, TX (US); Ruiqi Tian, Pflugerville, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/873,810

(22) Filed: Jun. 4, 2001

(65) Prior Publication Data

US 2002/0179902 A1 Dec. 5, 2002

(51) Int. Cl.$^7$ .............................................. H01L 23/544
(52) U.S. Cl. ........................ 257/620; 438/129; 364/491; 716/8
(58) Field of Search .......................... 257/48, 620, 797; 438/129, 424; 364/491; 716/8, 13

(56) References Cited

U.S. PATENT DOCUMENTS

| | | | |
|---|---|---|---|
| 5,278,105 A | 1/1994 | Eden et al. .................. | 437/250 |
| 5,386,088 A | 1/1995 | Gardner ...................... | 174/261 |
| 5,652,465 A * | 7/1997 | Hosoda et al. .............. | 257/758 |
| 5,665,633 A | 9/1997 | Meyer ........................ | 438/427 |
| 5,747,380 A | 5/1998 | Yu et al. .................... | 438/599 |
| 5,885,856 A | 3/1999 | Gilbert et al. .............. | 438/129 |
| 5,923,563 A | 7/1999 | Lavin et al. ................ | 364/488 |
| 5,948,573 A | 9/1999 | Takahashi ................... | 430/5 |
| 5,956,618 A | 9/1999 | Liu et al. ................... | 438/926 |
| 5,970,238 A * | 10/1999 | Shibata et al. ......... | 395/500.09 |
| 6,087,733 A | 7/2000 | Maxim et al. .............. | 257/797 |
| 6,232,161 B1 * | 5/2001 | Chen et al. ................ | 438/199 |
| 6,281,049 B1 * | 8/2001 | Lee ........................... | 438/129 |
| 6,448,630 B1 * | 9/2002 | Komori ...................... | 257/625 |
| 6,486,066 B2 * | 11/2002 | Cleeves et al. ............. | 438/692 |

FOREIGN PATENT DOCUMENTS

| | | | |
|---|---|---|---|
| EP | 0 712 156 A2 | 5/1996 | ......... H01L/21/768 |
| EP | 825 644 A1 | 2/1998 | ......... H01L/21/762 |
| EP | 0 933 811 A2 | 8/1999 | |
| JP | 59-186342 | 10/1984 | ........... H01L/21/76 |
| JP | 09107028 | 4/1997 | |
| JP | 10-293391 | 4/1998 | ............. G03F/1/08 |
| JP | 10-144635 | 5/1998 | ......... H01L/21/304 |
| JP | 11-111718 | 4/1999 | ....... H01L/21/3205 |
| JP | 11-126822 | 5/1999 | ........... H01L/21/82 |
| JP | 2000-124305 | 4/2000 | |
| WO | WO 96/15552 | 5/1996 | ......... H01L/23/053 |
| WO | WO 01/01469 A2 | 1/2001 | |

OTHER PUBLICATIONS

George Y. Liu et al., "Chip–Level CMP Modeling and Smart Dummy for HDP and Conformal CVD Films", Proceedings of CMP–MIC, Feb. 11, 1999, (8 pgs.).

Brian E. Stine et al., "The Physical and Electrical Effects of Metal–Fill Patterning Practices for Oxide Chemical–Mechanical Polishing Processes", IEEE Transactions On Electron Devices, vol. 45, No. 3, Mar. 1998, pp. 665–679.

Wei Huang et al., "A Layout Advisor for Timing–Critical Bus Routing", 1997 IEEE, pp. 210–214.

(List continued on next page.)

*Primary Examiner*—George Eckert
(74) *Attorney, Agent, or Firm*—Kim-Marie Vo; James L. Clingan, Jr.

(57) ABSTRACT

A method for forming an integrated circuit device having dummy features and the resulting structure are disclosed. One embodiment comprises a first active feature separated from a substantially smaller second active feature by a dummy-available region void of active features. Within the dummy-available region and in close proximity to the second active feature exists a dummy feature.

16 Claims, 7 Drawing Sheets

OTHER PUBLICATIONS

Andrew B. Kahng et al., "Filling and Slotting: Analysis and Algorithms", UCLA Dept. of Computer Science, LA, California; website address {abk,huijuan,alexz}@cs.ucla.edu; pp. 95–102.

B. Stine et al., "A Closed–Form Analytic Model For ILD Thickness Variation In CMP Processes", Proc. CMP–MIC, Santa Clara, Feb. 1997.

Andrew B. Kahng et al., "Filling Algorithms and analyses for Layout Density Control", IEEE Transactions On Computer–Aided Design Of Integrated Circuits and Systems, vol. 18, No. 4, Apr. 1999, pp. 445–462.

Ruiqi Tian et al., "Model–Based Dummy Feature Placement for Oxide Chemical–Mechanical Polishing Manufacturability", Proceedings 2000 Design Automation Conf., Jun., pp. 667–670.

Ruiqi Tian et al., "Filling and Slotting For Process Uniformity Control In Copper Chemical–Mechanical Polishing", Mar., 2001 Proceesings Sixth Int'l. Chemical–Mechanical Planarization for ULSI Multilevel Interconnection Conf. (CMP–MIC) Cat. No., 01 IMIC—600P, pp. 57–62.

Ruiqi Tian et al., "Dummy Feature Placement for Chemical–Mechanical Polishing Uniformity in a Shallow Trench Isolation Process", ACM Press, Proceedings of ISPD'01 2001 Int'l. Symposium on Physical Design, pp. 118–122.

Ruiqi Tian et al, "Proximity Dummy Feature Placement and Selective Via Sizing for Process Uniformity in a Trench–First–Via Last Dual–Inlaid Metal Process", Proceedings of the Jun. 2001 Int'l. Interconnect Tech.Conf., pp. 48–50.

Ruiqi Tian et al., "Model–Based Dummy Feature Placement for Oxide Chemical–Mechanical Polishing Manufacturability", 2001 IEEE Transactions, pp. 902–910.

* cited by examiner

METHOD OF FORMING AN INTEGRATED CIRCUIT DEVICE USING DUMMY FEATURES AND STRUCTURE THEREOF

RELATED APPLICATION

This is related to U.S. patent application Ser. No. 09/340,697 filed Jun. 29, 1999, and entitled "Integrated Circuit Device And A Process For Designing A Mask" and is assigned to the current assignee hereof.

FIELD OF THE INVENTION

This invention relates in general to integrated circuit devices and more particularly, to integrated circuit devices having dummy features.

BACKGROUND

Polishing is used to planarize surfaces in forming integrated circuit devices. Traditionally, no tiling has been used in forming integrated circuit devices. When no tiling is used, polishing causes dishing or other problems related to non-uniform thickness across an integrated circuit device substrate. These problems include exceeding the depth of focus for lithography or etch related concerns.

Dummy features have been used in an attempt to solve the problems related to dishing and other accumulated thickness effects. Dummy features used to aid polishing are formed by "tiling" because, from a top view of the integrated circuit device, the pattern of dummy features looks like tiles. The process for tiling typically includes creating a circuit layout, defining a buffer zone (typically in a range of approximately 1–10 microns) around active features within the layout, and combining the circuit layout with the minimum zone to determine excluded areas. All other areas are available for tiling.

Regardless of circuit density, tiling is used if the distance between any of the active features is at or above a minimum width except for certain exclusion zones. Typically, the minimum width is no more than 10 microns, and can be approximately 10 microns. Tiles or at least partial tiles are placed in available areas at least 5 microns wide. The tiling pattern (i.e. size and density of tiles) is usually the same across the integrated circuit device. See FIG. 5 in each of U.S. patent application Ser. No. 5,278,105 and European published patent application number 0 712 156 (1996). Although portions of tiles are missing, the same feature density is used.

BRIEF DESCRIPTION OF THE DRAWINGS

The present invention is illustrated by way of example and not by limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

Physical proximity effects, electrical proximity effects, or both are taken into account when determining where to place polishing dummy features. Polishing dummy features can be inserted, removed, moved, or otherwise modified at one or more feature levels to achieve sufficient planarity without adversely affecting the performance of the integrated circuit device. In essence, more selective placement of polishing dummy feature patterns, rather than somewhat indiscriminate placement of polishing dummy feature patterns, is used. When implemented to its greatest extent, embodiments of the present invention allow for sufficient planarity.

A number of terms are defined below to aid in the understanding the specification.

1. Active features are features that correspond to the designed circuitry for an integrated circuit device. The active features include portions of transistors, capacitors, resistors, or the like. Active features include power supply features, which are designed to operate at a substantially constant potential, and signal features, which are designed to operate at one potential under one set of electronic conditions and a different potential at another set of electronic conditions.

2. Control features are features that help control the processing of a semiconductor substrate. Control features include alignment marks, structures for measuring dimensions of features ("CD bars"), electrical test structures, and the like. The control features are typically located within scribe lines between dice on an integrated circuit device substrate.

3. Environmental protection features are features having a primary (most important) function of protecting an integrated circuit device from post-fabrication environmental conditions. An edge ring seal around the die is the most common and about the only example of an environmental protection device. The edge ring seal provides mobile ion protection during dicing and packaging operations.

4. Integrated circuit area is the portion of the die with the active features. Typically, the integrated circuit area is bounded by bond pads near the edge of the die.

5. Peripheral area is the portion of a die that lies between the integrated circuit area and the scribe lines. In many integrated circuits, the peripheral area is the portion of the die lying between the bond pads and the scribe line.

6. Resolution-assist features are sub-resolution features that assist in the resolution of active features that are to be printed onto an integrated circuit device substrate. The resolution-assist features are present in a mask but are not printed as separate features onto a semiconductor substrate. Phase shifters are examples of resolution-assist features. For the purposes of this specification, features added for optical proximity correction are considered resolution-assist features.

7. Dummy features include features printed onto an integrated circuit device substrate, where the features are not any of the other types of features defined above. Different types of dummy features are used in integrated circuit devices for various reasons. Dummy bit lines are used in memory arrays along the outermost edges to allow all the active bit lines in the array to be uniformly patterned. Unlike dummy bit lines, polishing dummy features are dummy features added at a feature level of a mask of an integrated circuit device to improve polishing characteristics at the current or a subsequently formed level. A polishing dummy feature is not required for the proper operation of a device.

8. Electronic design rules are rules for minimum spacing, size of features, or overlap between features within an integrated circuit. The electronic design rules are determined in part by processing margins and device performance (immunity to latch up, leakage current, etc.)

9. Polishing dummy feature design rules are a subset of the electronic design rules but are specific to polishing dummy features. Traditionally, the minimum spacing between a polishing dummy feature and an active feature or another polishing dummy feature is at least one micron and typically is no more than approximately ten microns.

10. Differential exclusion zone is the difference, at the same feature level, between the minimum spacing between a polishing dummy feature and an active feature and the minimum spacing between two active features.

11. Dummy-available region is the portion of a die that can be occupied by dummy features. This portion is the difference between the area of the die and active control or environmental protection features and the features corresponding exclusion zones. In a preferred embodiment, this area is void of any active features.

12. Feature density is calculated by determining the fraction of an area that is occupied by features. In one embodiment, the area is square or circular in shape.

13. Low local feature density is a particular type of feature density. The term "local" means that the area has a width and a height of approximately 5 to 35 microns. A low local feature density value will usually be found in the vicinity of a small active feature (less than approximately 3 microns on each side) when there are no other features on any side of the small active feature for a distance of at least approximately 10 to 15 microns.

In one embodiment, the integrated circuit device has a first region at a feature level having a first desirable dummy feature density of zero, a first local area in the first region, a second region at the feature level having a second desirable dummy feature density which is greater than the first desirable dummy feature density, a first active feature 25 in the first local area, a second active feature 12 in the first local area, a dummy-available region between the first active feature and the second active feature having a dummy-free region traversing a first distance, and a first dummy feature 14 in a portion of the dummy-available region adjacent to the second active feature so that the first desirable dummy feature density is exceeded. In one embodiment, the desirable density feature density is calculated over an area greater than approximately 100×100 microns.

In another embodiment, the integrated circuit device has a first active feature region free from polishing dummy features 14, a polishing dummy feature region, and a dummy-available region adjacent to at least a portion of the polishing dummy feature region. The polishing dummy feature region has a first polishing dummy feature density adjacent to and surrounding the first active feature region and the dummy-available region has a second polishing dummy feature density. The second polishing dummy feature density is substantially less than the first polishing dummy feature density. In one embodiment, the first active feature region is less than 400 square microns. Additionally, the dummy-available region may be at least 400 square microns. The integrated circuit device may also be partially populated with active features. The polishing dummy feature region may also have at least rows of dummy features surrounding the first active feature region. The present invention is defined by the claims and is better understood after turning to the figures.

Figure 1:
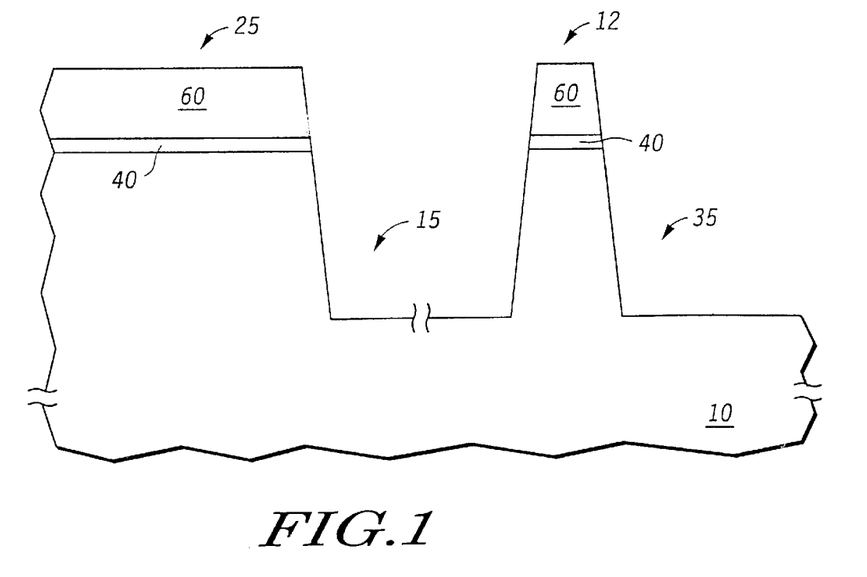
FIG. 1 includes an illustration of a cross-sectional view of a portion of a semiconductor substrate and patterned layers.

FIG. 1 is a cross-section of an area between subsequently formed transistors before formation of gate electrodes of an integrated circuit device of semiconductor device. The transistors are formed on a semiconductor substrate 10. The semiconductor substrate 10 may be silicon, silicon on insulator (SOI), gallium arsenide or the like. In a preferred embodiment, semiconductor substrate 10 is monocrystalline silicon or polycrystalline silicon. Both an active feature 12 and an active feature 25 are formed from portions of the semiconductor substrate 10, a pad oxide layer 40 and a nitride layer 60. To form the active features 12 and 25, the pad oxide layer 40 and the nitride layer 60 are formed by any suitable process such as chemical vapor deposition (CVD), physical vapor deposition (PVD), a spin-on process, thermal growth, the like and combinations of the above. In one embodiment, the pad oxide layer 40 is 140 Angstroms (in thickness) of silicon dioxide and is formed by thermal growth. In the same or a different embodiment the nitride layer 60 is 1400 Angstroms (in thickness) and is deposited by CVD or PVD. Next, the pad oxide layer 40, the nitride layer 60 and the semiconductor substrate 10 are patterned and etched to form trenches 15 and 35 and active features 12 and 25.

Figure 12:
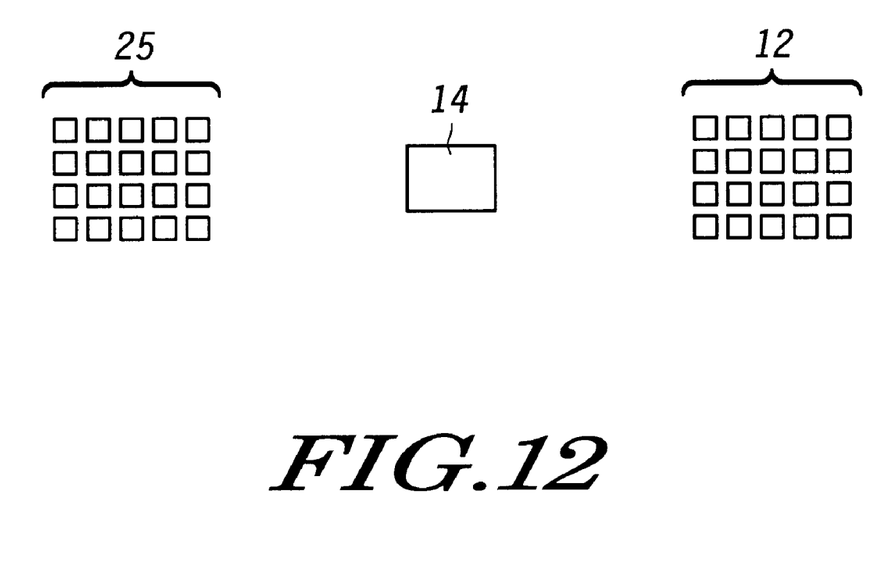
FIG. 12 includes an illustration of a planar view of another embodiment of the present invention.

The trenches 15 and 35 contain dummy-available regions. The trench 15, which is within semiconductor substrate 10, separates the active features 12 and 25 by at least approximately 10 microns or more specifically at least approximately 20 microns. Active feature 12 has a low local feature density. In this embodiment, the width of active feature 12 is approximately 0.2 microns. The width of active features 25 and 12 is measured at the top of the feature. In one embodiment, active feature 12 is separated from another active feature by trench 15, which is at least 10 microns in length. The trenches 15 and 35 contain dummy-available regions. In one embodiment, the active feature 25 is at least as wide as active feature 12. In another embodiment, the active feature 12 has a width substantially smaller than the width of the active feature 25. In one embodiment, the active feature 25 is 10 microns in width. In another embodiment, the active feature 25 or 12 is a group of smaller active features. The smaller active features can be a plurality of high-density active features, as shown in FIG. 12. In this embodiment, the width of the group of active features 25 would be the total of the width of each active feature (at the top of the feature) plus the distance between each active feature measured between the tops of the features.

Figure 2:
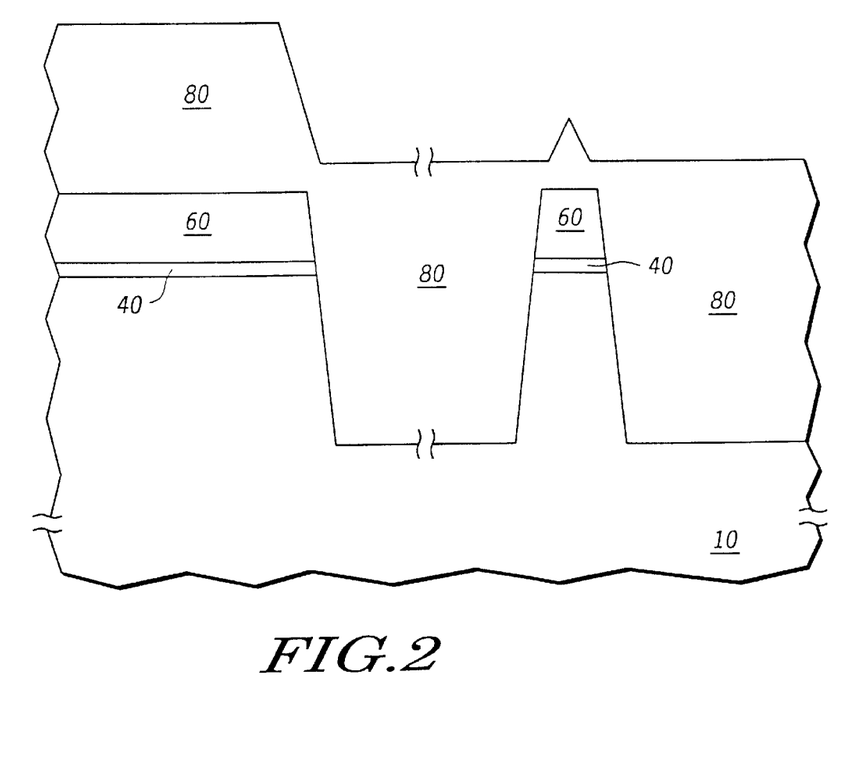
FIG. 2 includes an illustration of a cross-sectional view of the semiconductor substrate and patterned layers after depositing a first dielectric layer over the patterned layers.
Figure 3:
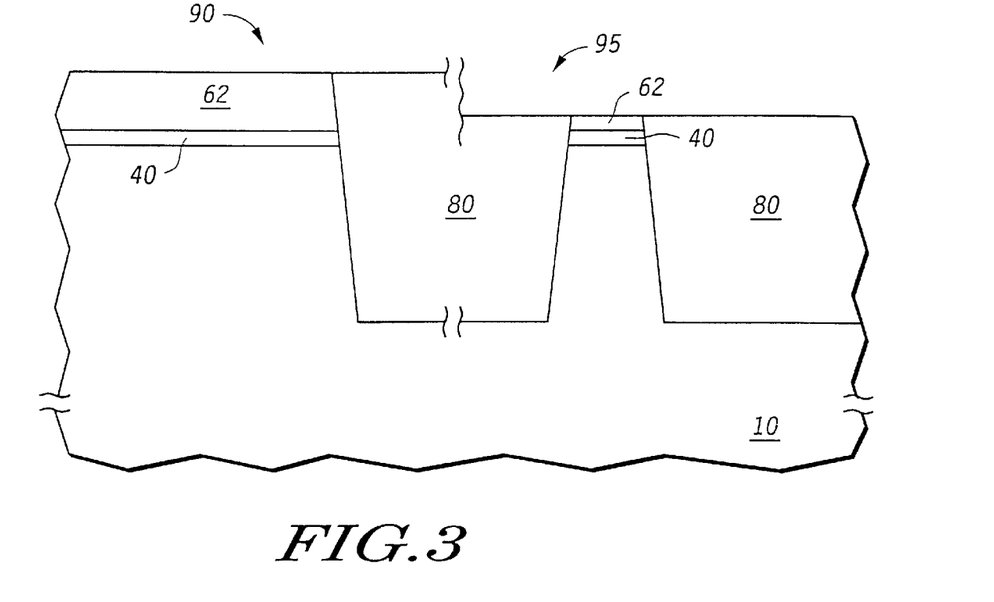
FIG. 3 includes an illustration of a cross-sectional view of the semiconductor substrate and patterned layers after polishing.

A first dielectric layer 80 is deposited over the remaining nitride layer 60 and within trenches 15 and 35, as shown in FIG. 2. Typical processes for depositing a dielectric such as CVD, PVD, combinations of the above, and the like are used. Typically, dielectric layer 80 is 3,000–10,000 Angstroms of silicon dioxide. The first dielectric layer 80 is planarized using a chemical mechanical polishing (CMP) process which results in a first substantially planar surface 90 and a second substantially planar surface 95, as shown in FIG. 3. After planarization, the first dielectric layer 80 primarily remains only within the trenches 15 and 35. In addition, the nitride layer 60 is thinner resulting in a nitride layer 62. The substantially planar surfaces 90 and 95 within the trench 15, however, are not substantially coplanar with each other, which was discovered by the Inventors. In other words, the first dielectric layer 80 has substantially different thicknesses after planarization depending on where within the trench 15 the thickness is measured. This is due to the different polishing rates of the first dielectric layer 80 over the active features 12 and 25.

Figure 4:
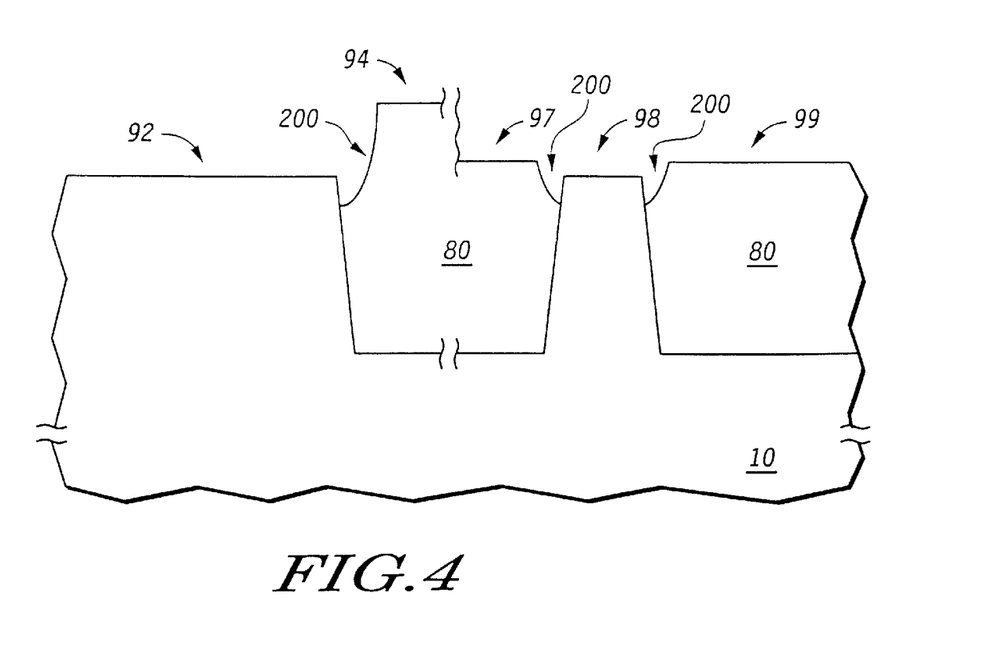
FIG. 4 includes an illustration of a cross-sectional view of the semiconductor substrate after removing the patterned layers.

The nitride layer 62 and the pad oxide layer 40 are removed using a wet etch, dry etch, combinations of the above or the like. In one embodiment, a dry etch is performed using chemistries including fluorine, such as $CF_4$ or $NF_3$, remove the pad oxide layer 40 and chemistries including carbon and fluorine, such as $CF_4$, remove the nitride layer 62. The etch results in recesses 200 within the first dielectric layer 80, as shown in FIG. 4.

Figure 5:
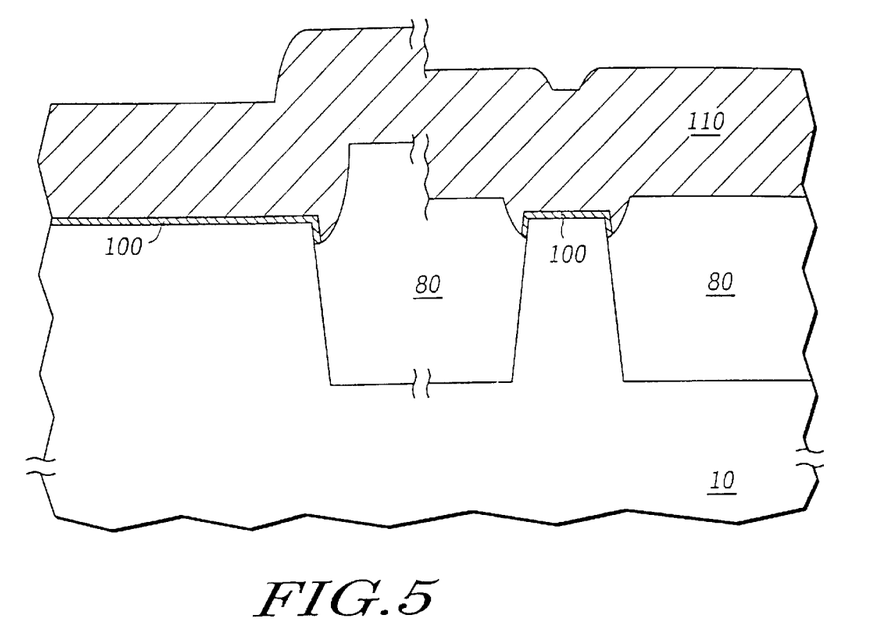
FIG. 5 includes an illustration of a cross-sectional view of a portion of the semiconductor substrate after forming a conductive layer.

Turning to FIG. 5, a second dielectric layer 100 is formed over active features 25 and 12. In one embodiment, second dielectric layer 100 is a thermally grown silicon dioxide layer. Alternately, CVD, PVD, the like and combination of the above may be used to form second dielectric layer 100. If CVD or PVD is performed, patterning and etch processing may be needed. In another embodiment, the second dielectric layer can be formed by CVD, PVD or atomic layer deposition (ALD) and can be a high-K material such as $ZrO_2$ and $HfO_2$. The second dielectric layer 100 will be patterned and etched to form the gate oxide of a transistor formed in an adjacent area of the semiconductor device. A conductive layer 110 is deposited over substrate 10 by CVD, PVD, combinations thereof, or the like. The conductive layer 110 can be polysilicon, a material including a metal, or another conductive material. The conductive layer 110 will be patterned and etched to form a gate electrode of a transistor being formed over the semiconductor substrate 10.

Figure 6:
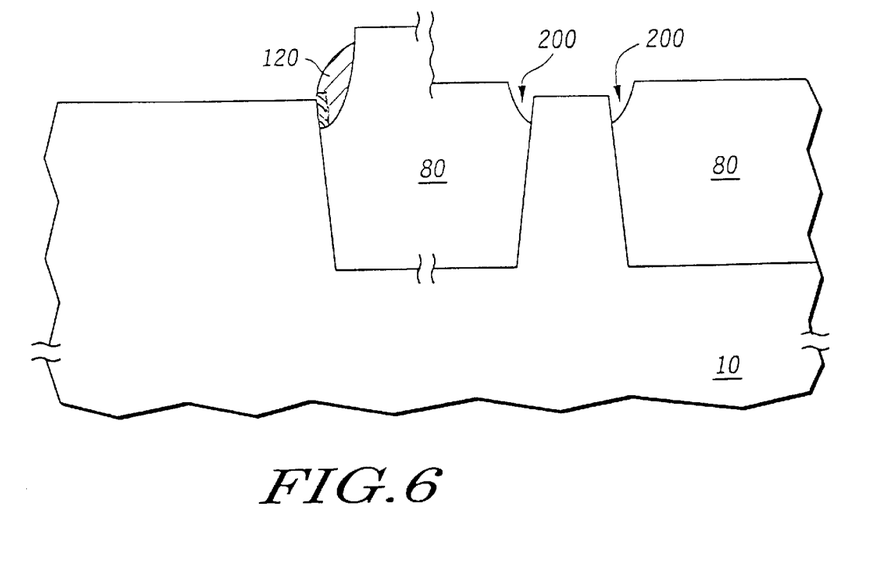
FIG. 6 includes an illustration of a cross-sectional view of a portion of the semiconductor substrate after removing a portion of the conductive layer.

After conductive layer 110 and dielectric layer 100 are removed by a wet etch, dry etch, or combination of the above, a stringer 120 can remain in the recess 200, as shown in FIG. 6. The stringer 120 is undesirable because it can electrically connect the gate electrodes of multiple transistors on the die, which are formed on either side of the area shown in the figures. In another embodiment, the stringer 120 causes a short or leakage of the integrated circuit device. The Inventors have recognized that problems such as the stringer 120 are due to the different polishing rates of active features 25 and 12.

Figure 7:
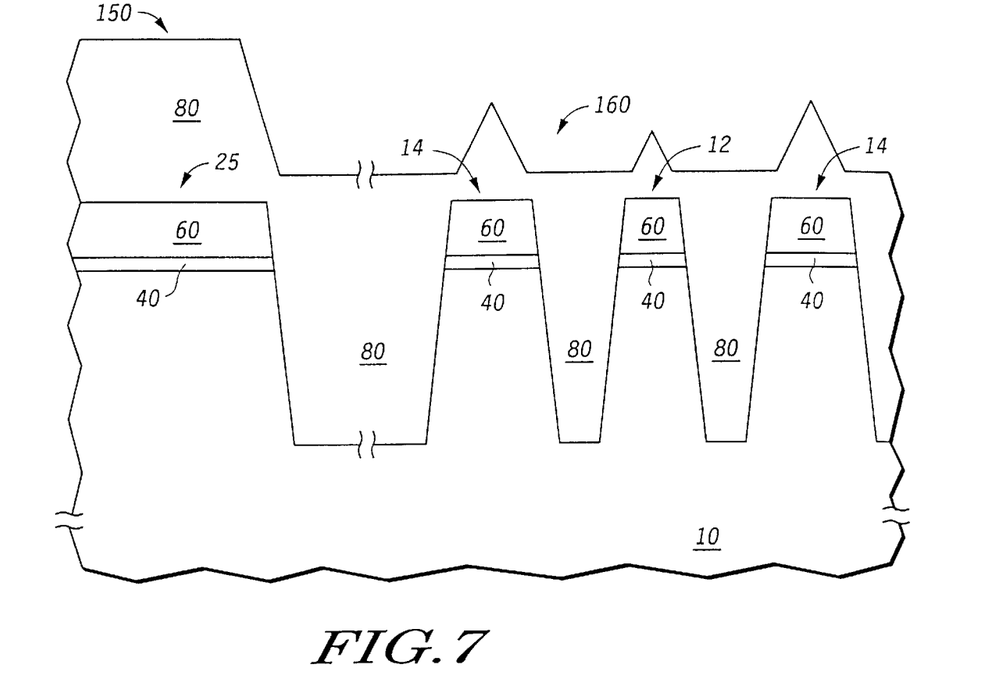
FIG. 7 includes an illustration of a cross-sectional view of a portion of the semiconductor substrate with dummy features, patterned layers and a first dielectric layer in accordance with an embodiment of the invention.

To compensate for the varying polishing rates of the first dielectric layer 80, dummy features 14 are formed during the formation of active feature 12 within close proximity to either side of active feature 12 and within dummy-available regions or trenches 15 and 35 as shown in FIG. 7. Like the active features 25 and 12, the dummy features 14 include the pad oxide layer 40 and the nitride layer 60. In one embodiment, the dummy features 14 are approximately 1–20 microns in width or more preferably, 1–10 microns in width. In one embodiment, they are wider than active feature 12. The widths of the dummy features 14 are also measured at the top of the feature. In one embodiment, the dummy features 14 are at least as wide as the active feature 12. In one embodiment, the trench 15 is at least 5 times the width of the dummy features 14 or more specifically 5–10 times the width of the dummy features 14. In one embodiment, there is a dummy available region between the active feature 25 and the dummy feature 14 that is void of dummy features 14, which can also be referred to as a dummy-free portion, and is at least 20 microns wide. In another embodiment, the dummy feature 14 is located in a first dummy-available region that separates the active feature 12 and the active feature 25 by at least 20 microns. The dummy feature 14 is in close proximity to the active feature 12. In one embodiment, the dummy feature 14 is within about 1 to 10 microns of the active feature 12. Furthermore, in one embodiment, the active feature 12 is substantially smaller in width than active feature 25. In this embodiment, there is a second dummy-available region between the dummy feature 14 and the active feature 25, which is at least 20 microns wide and void of dummy features. Additionally, there could also be another dummy feature in the first dummy-available region.

The first dielectric layer 80 is deposited over the active features 25 and 12 and the dummy features 14, as is shown in FIG. 7. Any materials or processes previously discussed in regards to the first dielectric layer 80 can be used.

Figure 8:
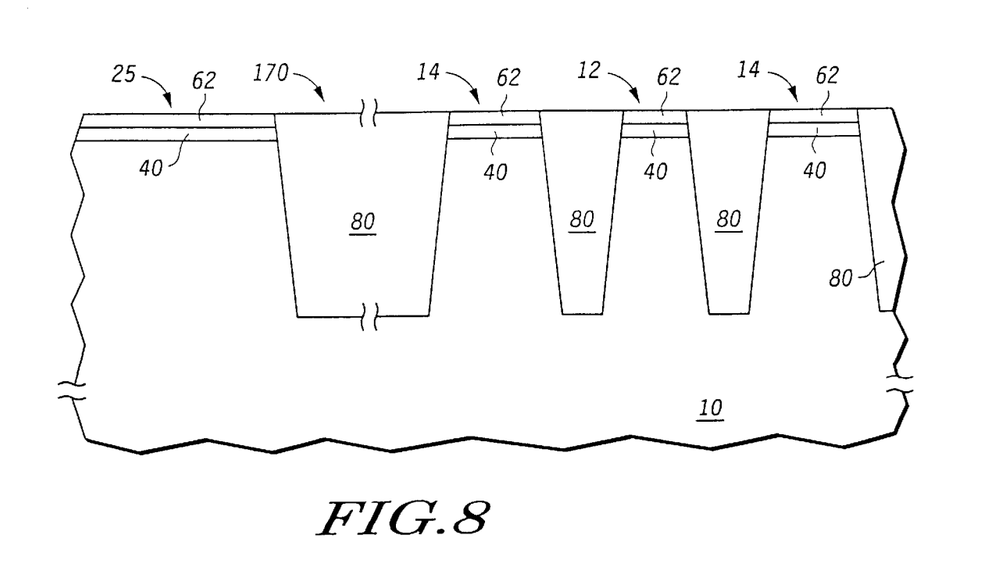
FIG. 8 includes an illustration of a cross-sectional view of a portion of a semiconductor substrate after removing a portion of the first dielectric layer in accordance with an embodiment of the present invention.

After the dielectric layer 80 and portions of nitride layer 60 are removed, a surface 170 of the integrated circuit device is substantially planar, as shown in FIG. 8. It is possible that in the dummy-available region without dummy features between the dummy features 14 and the active feature 25, that dielectric layer 80 may be non-planar. However, this is not important to the functionality of the device if there are no active features within this area as is the case in the preferred embodiment. In addition, the variation of thickness is over a smaller area than if the dummy features 14 were not present and less than the variation of the structure without the dummy features 14.

Figure 9:
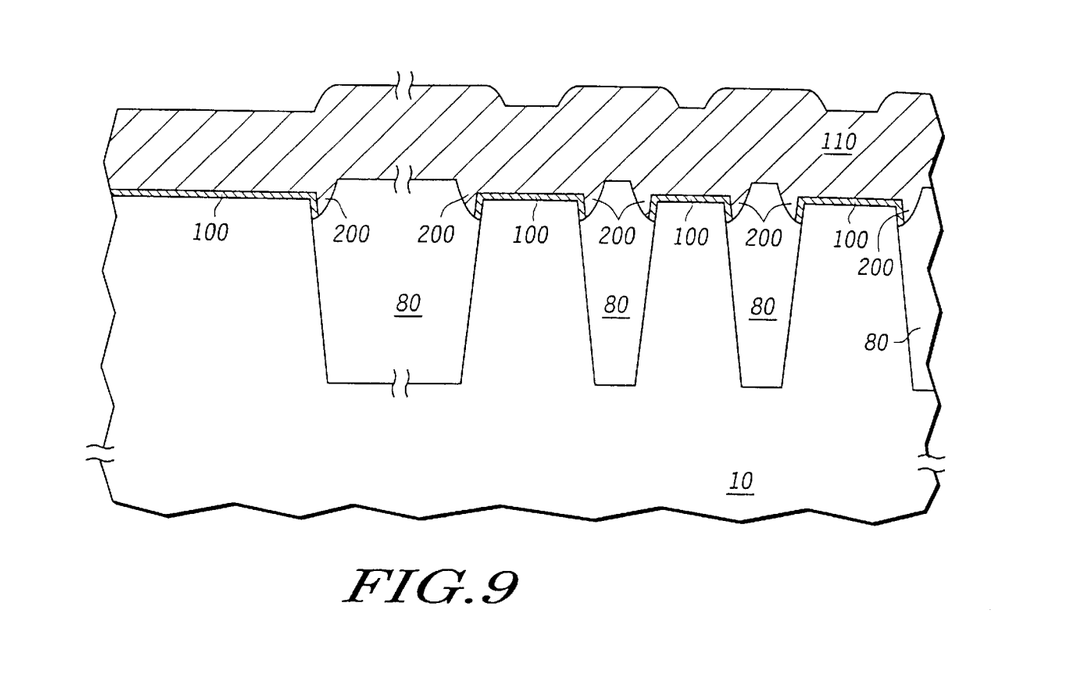
FIG. 9 includes an illustration of a cross-sectional view of a portion of a semiconductor substrate after removing the patterned layers and forming the second dielectric layer and the conductive layer in accordance with an embodiment of the present invention.
Figure 10:
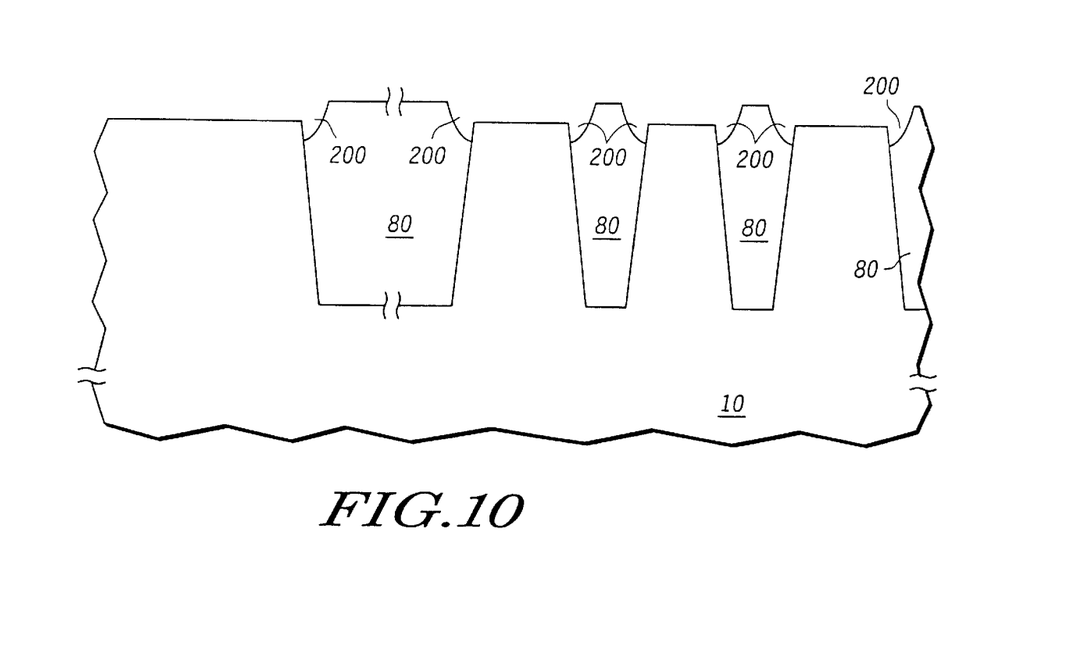
FIG. 10 includes an illustration of a cross-sectional view of a portion of a semiconductor substrate after removing a portion of the conductive layer in accordance with the present invention.

After polishing, the pad oxide layer 40 and the nitride layer 62 are stripped using a wet etch chemistry as previously discussed. The second dielectric layer 100 and the conductive layer 110 are formed over semiconductor substrate 10, as shown in FIG. 9. The same materials and processes as were previously discussed in regards to FIG. 5 can be used. When the conductive layer 110 is removed the stringers 120 are not present when the dummy features 14 are added, as is shown in FIG. 10. This is due to the recess 200 being smaller and more consistent than without the dummy features 14.

If desired or necessary, additional dummy features at the same or a different feature level can be added to the integrated circuit device to account for other problems, such as polishing issues.

Figure 11:
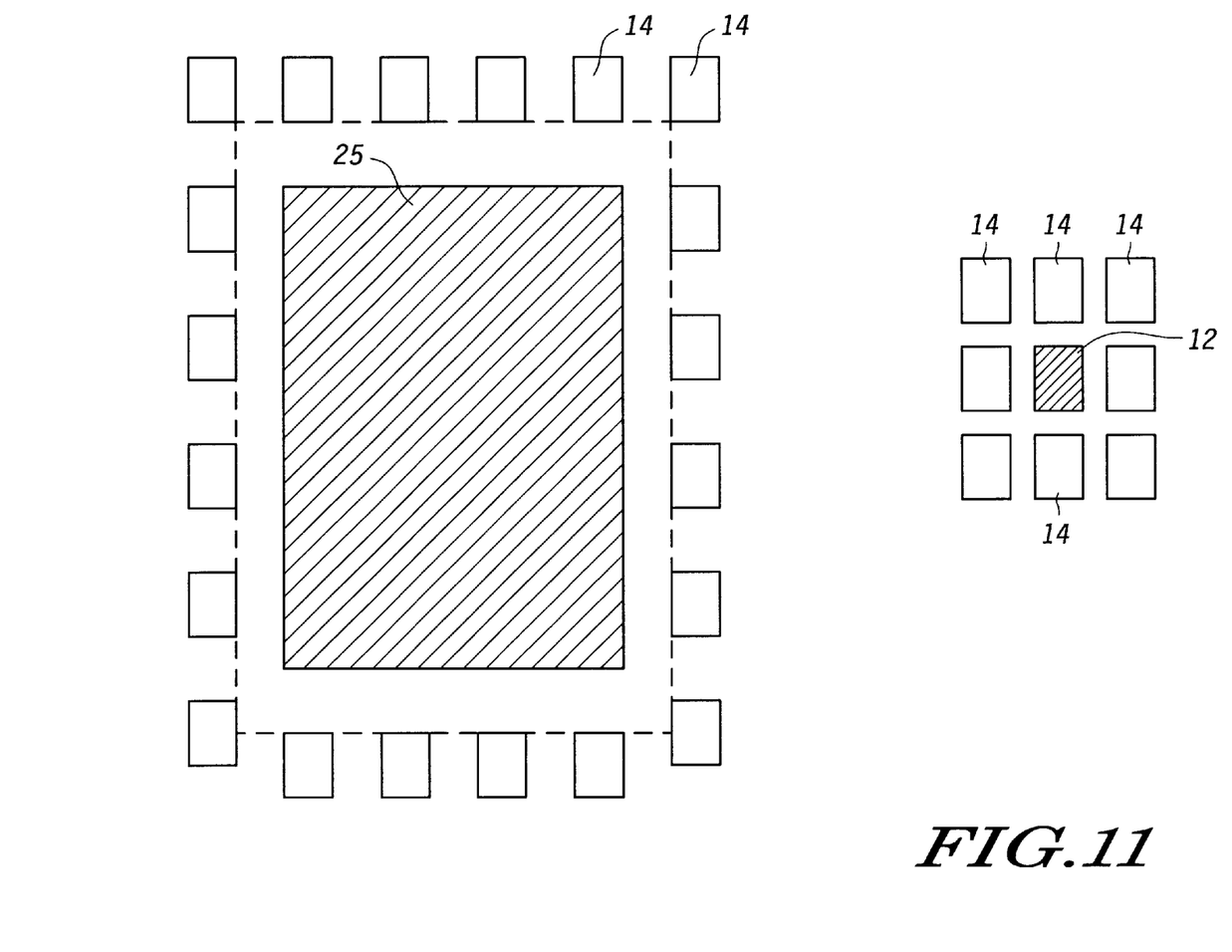
FIG. 11 includes an illustration of a planar view of one embodiment of the present invention.

FIG. 11 shows a planar view of active features 25 and 12 surrounded by dummy features 14 and 30. As was previously described in regards to FIGS. 7–10, the dummy features 14 were adjacent two sides of the active feature 12. The active feature 12 was not necessarily surrounded on all sides by dummy features 14 and the active feature 25 was not surrounded by any dummy features 14. The presence or absence of the dummy features 14 surrounding the active features 12 and 25 depends on the feature density at various edges of the active features 12 and 25. In one embodiment, as was previously described, the active feature 25 was not surrounded by any dummy features because the feature density of the active feature 25 was great enough. As is illustrated in FIG. 11, in another embodiment, the active feature 25 is fully surrounded by dummy features 30, because the active feature 25 has a low local feature density. Thus, the dummy features 14 are added to increase the feature density. The plurality of dummy features 14 around the active feature 25 are separated from the active feature 25 by a first distance, which can be the same distance that dummy features 14 are separated from active feature 12. In an alternate embodiment, if the feature density is low at the corners of active feature 25 and not on the edges, the dummy features 14 may only exist at the corners. The same holds true for the active feature 12. For example, in the embodiment previously described the active feature 12 was surrounded by the dummy features 14 on two sides. In an alternate embodiment, the active feature 12 can be surrounded on all sides by the dummy features 14, as shown in FIG. 11. Again, this is dependent on the feature density at certain corners and edges of the active features 12 and 25. Generally, if the feature density is below 25 to 75 percent, dummy features are added.

In the foregoing specification, the invention has been described with reference to specific embodiments. However, one of ordinary skill in the art appreciates that various modifications and changes can be made without departing from the scope of the present invention as set forth in the claims below. For example, doping steps that may occur in other areas of the semiconductor substrate 10 to form the source and drain regions of the transistor may occur in between the processes discussed. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. An integrated circuit device, comprising:
   a semiconductor substrate;
   a first active feature in the semiconductor substrate, wherein the first active feature has a first width;
   a second active feature in the semiconductor substrate, wherein the second active features has a second width substantially smaller than the first active feature;
   a first dummy-available region in the semiconductor substrate separating the first active feature from the second active feature by at least 20 microns, wherein the first dummy available-region is void of any active features;
   a first dummy feature in the first dummy-available region and in close proximity to the second active feature; and
   a second dummy-available region in the first dummy-available region separating the first dummy feature from the first active feature by at least 20 microns, wherein the second dummy-available region is void of dummy features.

2. The integrated circuit device of claim 1, wherein the second active feature and the first dummy feature are separated by a first distance.

3. The integrated circuit device of claim 2, further comprising:
   a plurality of dummy features surrounding the second active feature and separated from the second active feature by the first distance.

4. The integrated circuit device of claim 3 further comprising a second dummy feature in the first dummy-available region and in close proximity to the first active feature.

5. The integrated circuit device of claim 1, wherein the first active feature comprises a plurality of high-density active features.

6. The integrated circuit device of claim 1, wherein the first dummy feature has a third width, the third width being at least as large as the second width.

7. The integrated circuit device of claim 6, wherein the third width is at least one micron.

8. The integrated circuit device of claim 7, wherein the first active feature comprises a plurality of high-density active features.

9. The integrated circuit device of claim 8 further comprising a second dummy feature in the first dummy-available region and in close proximity to the first active feature.

10. The integrated circuit device of claim 9, wherein the second active feature and the first dummy feature are separated by a first distance and further comprising:
    a plurality of dummy features surrounding the second active feature and separated from the second active feature by the first distance.

11. The integrated circuit device of claim 1, wherein the second active feature comprises a plurality of high-density active features.

12. An integrated circuit device, comprising:
    a first active feature region free from polishing dummy features;
    a polishing dummy feature region having a first polishing dummy feature density adjacent to and surrounding the first active feature region; and
    a dummy-available region adjacent to at least a portion of the polishing dummy feature region having a second polishing dummy feature density, wherein the second polishing dummy feature density is substantially less than the first polishing dummy feature density.

13. The integrated circuit device of claim 12, wherein the first active feature region is less than 400 square microns.

14. The integrated circuit device of claim 13, wherein the dummy-available region is at least 400 square microns.

15. The integrated circuit device of claim 14, wherein the integrated circuit device is partially populated with active features.

16. The integrated circuit device of claim 15, wherein the polishing dummy feature region comprises at least rows of dummy features surrounding the first active feature region.

* * * * *